United States Patent
Sasaki et al.

(10) Patent No.: US 7,312,019 B2
(45) Date of Patent: Dec. 25, 2007

(54) LINEAR GRATING FORMATION METHOD

(75) Inventors: Suguru Sasaki, Tokyo (JP); Satoshi Machida, Tokyo (JP); Takashi Taguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 482 days.

(21) Appl. No.: 11/066,495

(22) Filed: Feb. 28, 2005

(65) Prior Publication Data

US 2005/0196709 A1 Sep. 8, 2005

(30) Foreign Application Priority Data

Mar. 2, 2004 (JP) ............................ 2004-057713

(51) Int. Cl.
*H01L 21/027* (2006.01)

(52) U.S. Cl. ........................................ 430/321; 216/24

(58) Field of Classification Search ..................... None
See application file for complete search history.

(56) References Cited

U.S. PATENT DOCUMENTS 5,948,571 A 9/1999 Mih et al.
6,114,096 A 9/2000 Mih et al.
6,475,704 B1* 11/2002 Iwasaki et al. ............. 430/321
2002/0042024 A1* 4/2002 Tanaka et al. .............. 430/321

FOREIGN PATENT DOCUMENTS

| JP | 06-252031 | 9/1994 |
| JP | 10-254121 | 9/1998 |
| JP | 11-214280 | 8/1999 |
| JP | 2002-350623 A | * 12/2002 |

* cited by examiner

*Primary Examiner*—John A. McPherson
(74) *Attorney, Agent, or Firm*—Rabin & Berdo, PC

(57) ABSTRACT

A method of forming a linear grating is disclosed. When forming a first resist pattern covering certain surface regions of a substrate, the mask pattern position is shifted and the first resist pattern is formed such that the trench in the target region is completely filled with the first resist pattern even when an error in positioning occurs. The surface of the first resist pattern is etched, and a lower resist pattern is left to the same level as the uppermost step of the silicon substrate. On top of this, an upper resist pattern having the same pattern as the first resist pattern is formed. At this time, the mask pattern position is shifted and the exposure dose is adjusted such that one edge of the upper resist pattern is positioned on the lower resist pattern, and the other edge is positioned in a prescribed region border portion. The lower resist pattern and upper resist pattern are used as a mask to etch the silicon substrate.

10 Claims, 5 Drawing Sheets

STEP 1

STEP 2

STEP 3

STEP 4

STEP 5

STEP 6

STEP 7

STEP 8

STEP 9

STEP 10

STEP 21

STEP 22

STEP 23

STEP 24

STEP 25

STEP 26

LINEAR GRATING FORMATION METHOD

BACKGROUND OF THE INVENTION

1. Field of the Invention

This invention relates to a method of formation of a linear grating (diffraction grating) used for wavelength-division multiplexing and similar in optical communications.

2. Description of the Related Art

In order to transmit a plurality of optical signals with different wavelengths within a single optical fiber to increase the amount of information transmitted in communications using optical fibers, a diffraction grating to separate or to combine optical waves is used. In a linear grating, a silicon or other substrate with translucent properties is formed with the thickness in a stair-like structure, so that wave separation or combination is performed by changing the angle of diffraction of light for different wavelengths.

FIG. 2A to 2F of the accompanying drawings is a series of process diagrams showing an example of a conventional method of linear grating formation.

In this example, a silicon substrate 1 is used for the grating, and LSI manufacturing techniques are employed to form a seven-step linear grating. The manufacturing process will be described in detail below.

In Step 21 (FIG. 2A), first the surface of the silicon substrate 1 is divided into bands with a width of 7 μm, and each 7-μm band is divided into seven regions a through g with a width of 1 μm. Then, using photolithographic techniques, a resist pattern 2 is formed on the regions e, f and g among the seven regions. The resist pattern 2 is then used to etch and remove three steps' worth of material from the surface of the silicon substrate 1. Here, the height dimension of one step is, at minimum, approximately 0.2 μm.

In Step 22 (FIG. 2B), the resist pattern 2 is removed. As a result, the silicon substrate 1A, in which three steps' worth of the surface has been etched away in the regions a through d, is obtained, as shown in FIG. 2B.

In Step 23 (FIG. 2C), a resist pattern 3 is formed on the regions c, d, f and g of the surface of the silicon substrate 1A. Then etching is performed to remove two steps' worth of material from the surface of the silicon substrate 1A using the resist pattern 3.

In Step 24 (FIG. 2D), the resist pattern 3 is removed. As a result, as shown in FIG. 2D, five steps' worth of material are removed from the surface of the regions a and b, three steps' worth of material are removed from the surface of the regions c and d, and two steps' worth of material are removed from the surface of the region e, to obtain the etched silicon substrate 1B.

In Step 25 (FIG. 2E), the resist pattern 4 is formed on the surface regions b, d, e and g of the silicon substrate 1B. Then etching is performed to remove one step's worth of material from the surface of silicon substrate 1B using the resist pattern 4.

In Step 26 (FIG. 2F), the resist pattern 4 is removed. Thus, as shown in FIG. 2F, six steps' worth of material are removed from the surface region a, five steps' worth of material are removed from the surface region b, four steps' worth of material are removed from the surface region c, three steps' worth of material are removed from the surface region d, two steps' worth of material are removed from the surface region e, and one step's worth of material is removed from the surface region f by etching respectively, to obtain a silicon substrate 1C having a seven-step stair-shape surface.

Thereafter, the entire back surface of the silicon substrate 1C is etched to adjust the thickness appropriately, to obtain a seven-step linear grating.

Thus by using LSI manufacturing techniques, a small linear grating one edge of which is approximately 0.5 mm can be formed.

Although not linear gratings, similar techniques relating to methods for the formation of patterns in semiconductor substrates are described in, for example, three Japanese Patent Kokai (Laid-open Application) No. 6-252031, No. 10-254121, and No. 11-214280.

The conventional methods of forming the linear grating and other patterns have the following problems.

Referring to FIGS. 3A and 3B of the accompanying drawings, the problems with the conventional pattern formation methods are described.

For example, in Step 23 of FIG. 2C, suppose that the position of the resist pattern 3 formed on the surface of the silicon substrate 1A is shifted somewhat to the right from the intended position, as shown in FIG. 3A. As a result, some portions of the surface regions a and e of the silicon substrate 1A are covered by the resist pattern 3. When in this state the surface of the silicon substrate 1A is etched, and the resist pattern 3 is removed, then the portions of the regions a and e covered by the resist pattern 3 remain as protrusion defects X and Y on the silicon substrate 1B, as shown in FIG. 3B. Accordingly, there may be an impediment to subsequent manufacturing steps, and the completed linear grating may not have the desired characteristics.

SUMMARY OF THE INVENTION

An object of this invention is to provide a method of formation of a linear grating with satisfactory characteristics, without the occurrence of protrusion defects.

According to a first aspect of the invention, there is provided an improved method for forming a linear grating with a periodic stair-like structure by using in order a plurality of mask patterns for exposure to form resist patterns on a silicon substrate through photolithographic techniques, and etching the silicon substrate. The linear grating formation method includes selecting a mask pattern such that, when a shift in position of a resist pattern occurs due to a shift in exposure position, an edge portion of the resist pattern at which a protrusion defect will occur on the silicon substrate is limited to the uppermost step of the stair-like structure, and such that this edge portion exists only on a predetermined side of the resist pattern. The linear grating formation method also includes adjusting, when forming the resist pattern on the silicon substrate with the selected mask pattern, the position of the mask pattern such that the resist pattern completely covers the substrate surface at which the protrusion defect will occur. The linear grating formation method also includes etching the entire surface of the resist pattern formed on the silicon substrate until the height of the resist pattern becomes the same height as the surface of the silicon substrate before processing, thereby leaving the resist material as a lower resist pattern. The linear grating formation method also includes forming an upper resist pattern with the same mask pattern after adjusting both the mask pattern position and exposure dose such that an edge portion of the upper resist pattern at which the protrusion defect will occur is positioned on the lower resist pattern, and such that the opposite edge portion of the upper resist pattern is formed at a predetermined position. The linear grating formation method also includes etching the silicon substrate while using the lower resist pattern and the upper resist pattern as a mask.

Therefore, a linear grating with satisfactory characteristics can be formed without causing protrusion defects. Moreover, special mask patterns are not required for this method. In other words, the linear grating can be manufactured with the same minimum required number of mask patterns as in the prior art.

The above-described object and other objects of the invention, as well as novel characteristics and aspects, will become more fully evident when the following detailed description and appended claims are read and understood in conjunction with the accompanying drawings. The drawings are principally for the purpose of description, and the scope of the invention is not limited thereto.

DETAILED DESCRIPTION OF THE INVENTION

Figure 1A:
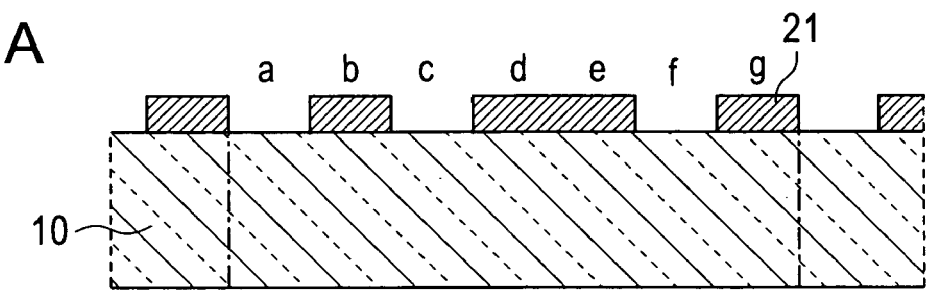
FIG. 1A to FIG. 1J is a series of diagrams to illustrate a method of formation of a linear grating according to an embodiment of the invention.

Referring to FIG. 1A to FIG. 1J, a method of forming a linear grating according to one embodiment of the present invention is described.

In this embodiment, LSI manufacturing techniques are used to form a seven-step linear grating on a silicon substrate 10.

In Step 1 (FIG. 1A), first the surface of the silicon substrate 10, having translucent properties, is divided into bands with a period of 7 μm width, and each of these bands is further divided into seven regions, a through g, with a 1 μm width. Then, using a first reticle (mask on which is drawn a mask pattern for exposure; not shown in the drawings), photolithographic techniques are employed to form a resist pattern 21 on the regions b, d, e and g among the seven regions. The resist pattern 21 is then used to perform etching to remove one step's worth of material from the surface of the silicon substrate 10. Here, the height dimension of one step is, at minimum, approximately 0.2 μm.

Figure 1B:
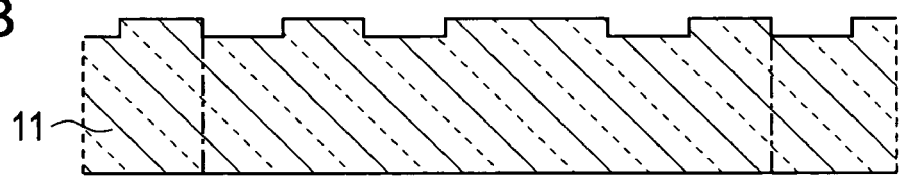
Figure 1C:
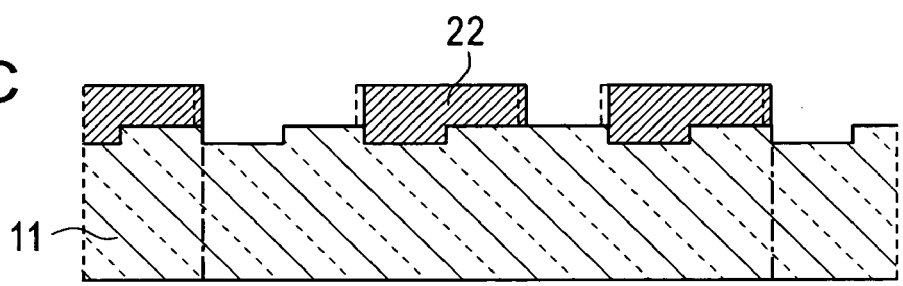
Figure 1D:
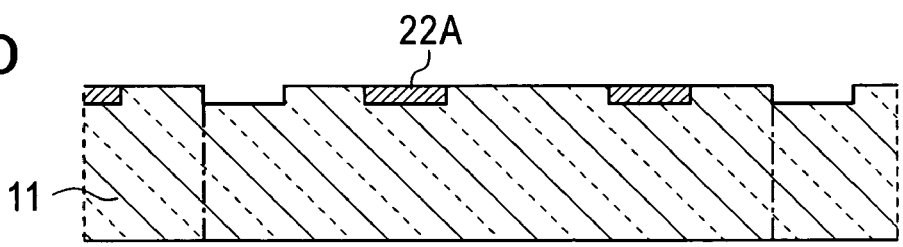
Figure 1E:
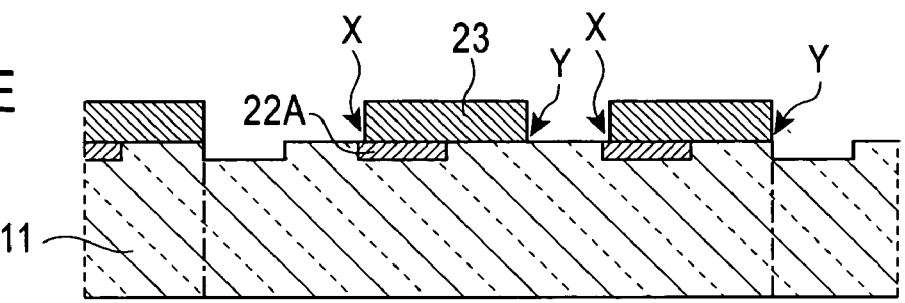
Figure 1F:
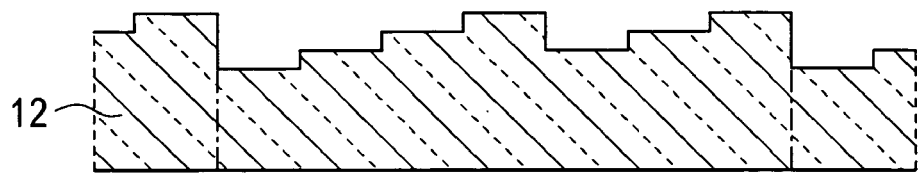
Figure 1G:
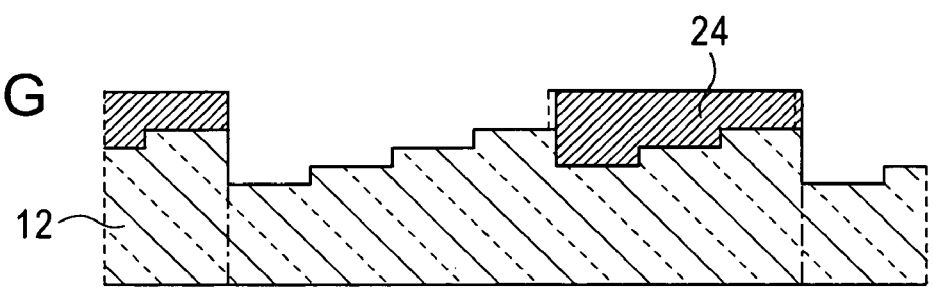
Figure 1H:
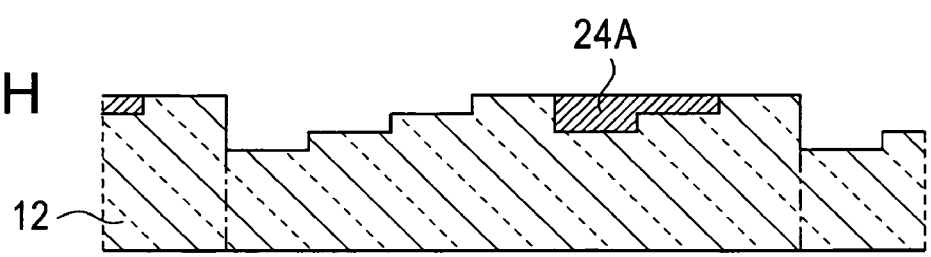
Figure 1I:
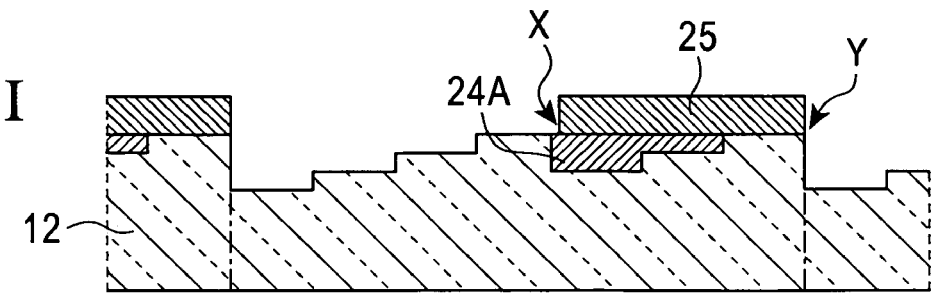
Figure 1J:
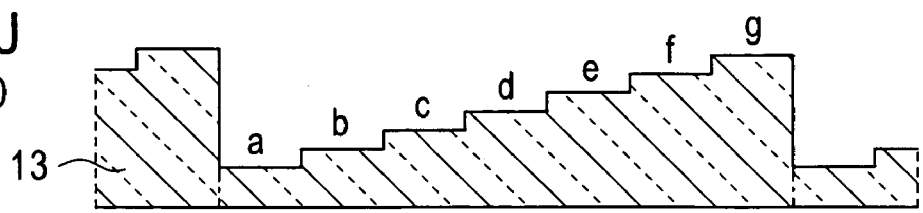
Figure 2A:
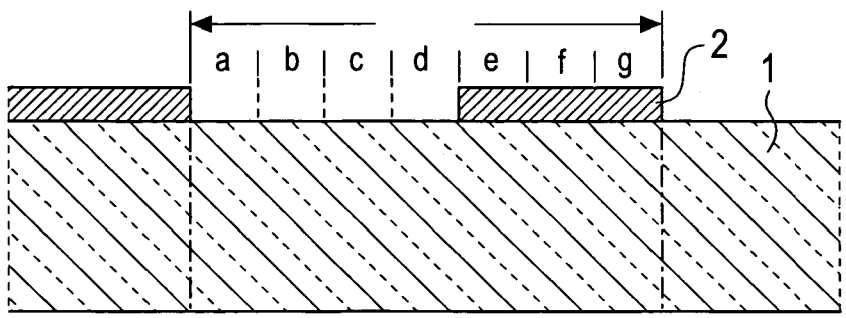
FIG. 2A to FIG. 2F is a series of diagrams to illustrate a linear grating formation method of the prior art.
Figure 2B:
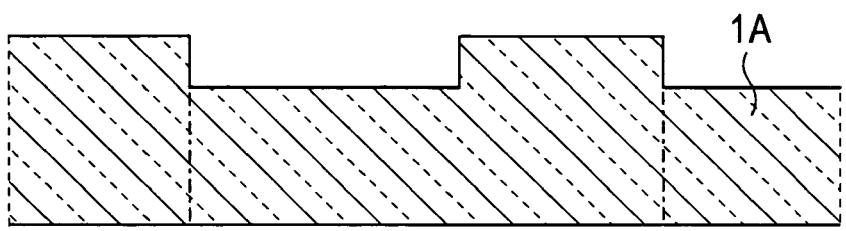
Figure 2C:
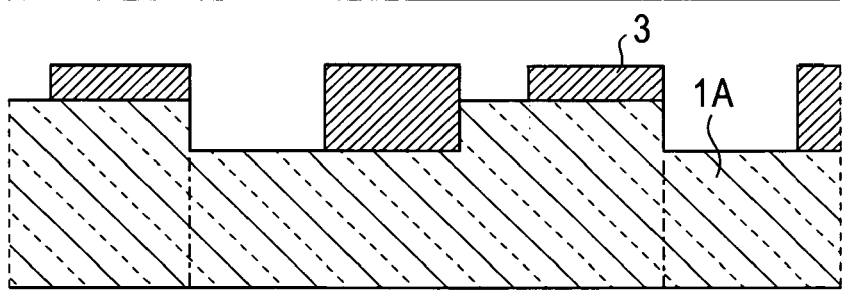
Figure 2D:
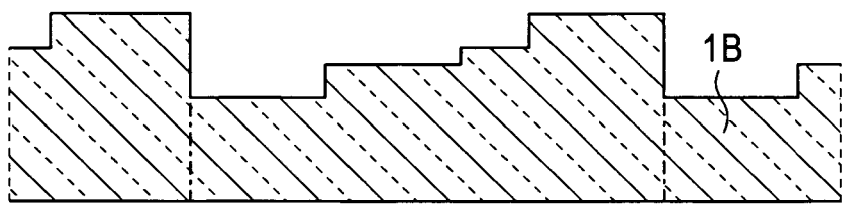
Figure 2E:
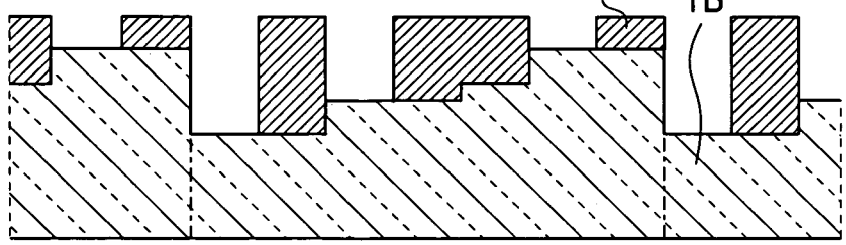
Figure 2F:
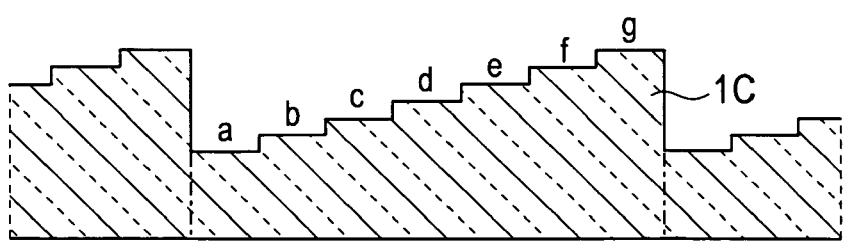
Figure 3A:
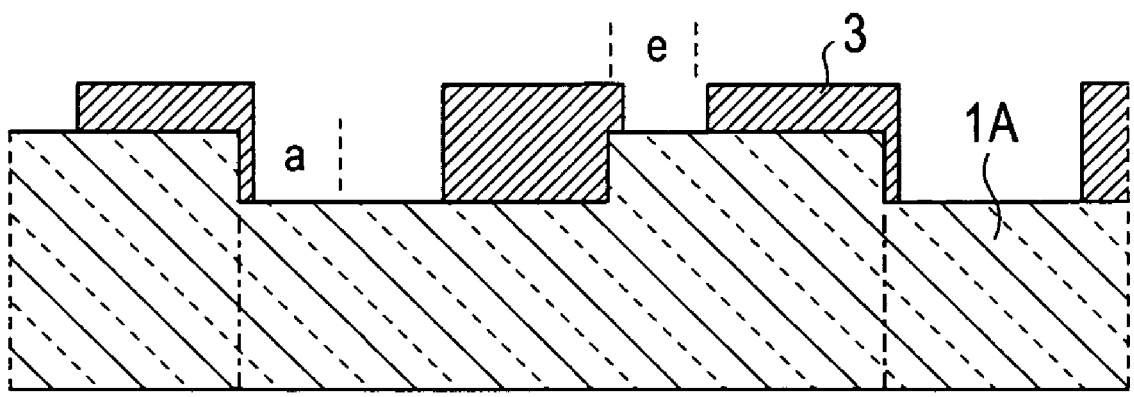
FIG. 3A and FIG. 3B are diagrams useful to explain problems with the linear grating formation method of the prior art.
Figure 3B:
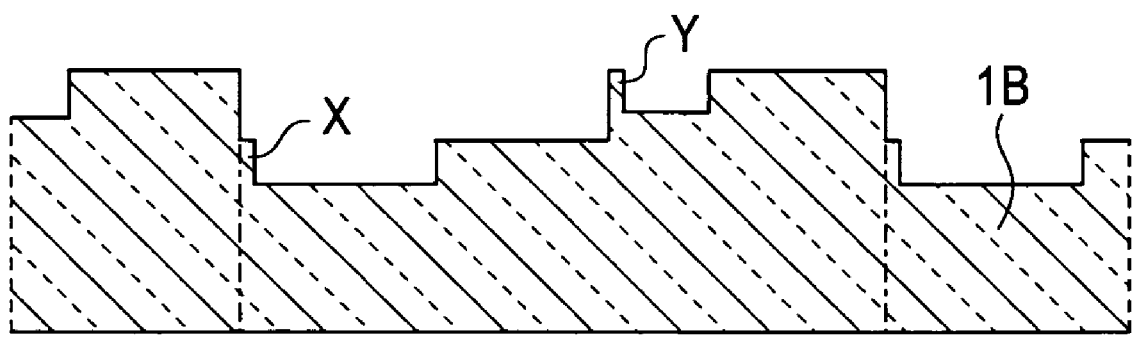

In Step 2 (FIG. 1B), the resist pattern 21 is removed. As a result, a silicon substrate 11 with one step's worth of etching performed at the surface regions a, c and f is obtained, as shown in FIG. 1B.

In Step 3 (FIG. 1C), a second reticle is used to form a resist pattern 22 on the surface regions C, d, f and g of the silicon substrate 11. At this time, the reticle position is adjusted to shift the position of the exposure pattern somewhat to the left side in the drawing, and etching is performed so that the trenches in the regions c and f formed in Steps 1 and 2 are completely filled with the resist pattern 22, and the resist pattern 22 does not extend into the region a. As indicated by the dashed lines, there is no problem even if the resist pattern 22 covers some portions of the regions b and e. Also, there is no problem even if portions of the regions e and g protrude from the resist pattern 22.

In Step 4 (FIG. 1D), the surface of the resist pattern 22 is etched so as to be the same height as the uppermost portions of the silicon substrate 11, that is, as the regions b and e. Thus, the trenches of the regions c and f are completely filled with the lower resist pattern 22A, as shown in the drawing, and only the trench of the region a is left. Prior to this etching, the resist film may be hardened by irradiation with ultraviolet rays or by other means, in order to increase the resistance to etching and/or facilitate resist coating in the next manufacturing step.

In Step 5 (FIG. 1E), the second reticle used in Step 3 is used to form an upper resist pattern 23 in the regions a, d, f and g of the surface of the silicon substrate 11. At this time, the positional relation of the exposure pattern and the base silicon substrate 11 is adjusted so that the exposure pattern is, for example, positioned 0.2 μm to the right in the figure, to perform exposure. This positioning displacement amount of 0.2 μm is a value which assumes a certain margin, given that the standard deviation of misalignment in positioning over the silicon substrate is within approximately 0.1 μm.

The reason for shifting to the right is to cause the borderline on the right side of the upper resist pattern 23 to coincide with the borderlines of the regions d and e and of the regions g and a. To this end, the resist exposure dose is controlled to adjust the width of the formed resist pattern. For example, when using a positive resist, the exposed portion is removed in the development step, so that by increasing the exposure dose, the width of the resist pattern can be reduced. Data indicating the relation between exposure dose and resist pattern width is prepared in advance by experiments, and based on this data the appropriate exposure dose can be determined. If a trial exposure is performed, still greater accuracy can be expected. As a result, an upper resist pattern 23 is formed such that the left edge is positioned over the lower resist pattern 22A as indicated by the arrow X in the drawing, and the right edge coincides with a prescribed borderline as indicated by the arrow Y.

The lower resist pattern 22A and upper resist pattern 23 are then used to etch and remove two steps' worth of material from the surface of the silicon substrate 11. In Step 6 (FIG. 1F), the resist patterns 22A and 23 are removed. As a result, a silicon substrate 12 is obtained which is etched such that three steps' worth are removed from the surface region a, two steps' worth are removed from the surface regions b and e, and one step's worth is removed from the surface regions c and f, as shown in the drawing.

In Step 7 (FIG. 1G), a third reticle is used to form a resist pattern 24 on the surface of the silicon substrate 12 in the regions e, f and g. At this time, similar to Step 3, the reticle position is adjusted and exposure is performed such that, by slightly shifting the exposure pattern position leftward in the drawing, the trenches in the regions e and f formed in Steps 5 and 6 are completely covered by the resist pattern 24, and the resist pattern 24 does not extend into the region a.

In Step 8 (FIG. 1H), the surface of the resist pattern 24 is etched so as to have the same height as the uppermost portion of the silicon substrate 12, that is, of the region d. Thus, the trenches in the regions e and f are completely covered by the lower resist pattern 24A remaining after etching, and the trenches in the regions a, b and c are left, as shown in the drawing.

In Step 9 (FIG. 1I), the third reticle used in Step 7 is used to form the upper resist pattern 25 on the surface of the silicon substrate 12 in the regions e, f and g. Similar to Step 5, the exposure pattern is shifted rightward in the drawing and the exposure dose is adjusted. In this way, an upper resist pattern 25 is formed with the left edge positioned on the lower resist pattern 24A, and the right edge coinciding with the borderline of the regions g and a.

The lower resist pattern 24A and upper resist pattern 25 are then used to etch and remove three steps' worth of the surface of the silicon substrate 12.

In Step 10 (FIG. 1J), the resist patterns 24A and 25 are removed. Thus, as shown in the drawing, six steps' worth of material are removed from the surface region a, five steps' worth from the surface region b, four steps' worth from the surface region c, three steps' worth from the surface region d, two steps' worth from the surface region e, and one step's worth from the surface region f, to obtain a silicon substrate 13 having a seven-step stair-like surface.

Thereafter, the entire back surface of the silicon substrate 13 is etched to adjust the thickness appropriately, to obtain a seven-step linear grating.

Thus in the method of linear grating formation of this embodiment, by using the second reticle and shifting the position of the exposure pattern somewhat to the left in the drawing to perform exposure in Step 3, the trenches of the regions c and f formed in Steps 1 and 2 are completely filled with the resist pattern 22, and the resist pattern 22 does not extend into the region a. In Step 4, the surface of the resist pattern 22 is etched so as to be the same height as the uppermost portions of the silicon substrate 11. As a result, the trenches of the regions c and f are completely filled with the lower resist pattern 22A, and the position of the left edge of the resist pattern 22A can be accurately aligned with the borderline of the regions c and d.

In Step 5, the same reticle as in Step 3 is used, but the exposure pattern is shifted rightward and the exposure dose is controlled, so that the upper resist pattern 23 is formed with the left edge positioned on the lower resist pattern 22A and the right edge coinciding with the prescribed borderline. Since the combined lower resist pattern 22A and upper resist pattern 23 are utilized as the resist pattern, the resulting linear grating has satisfactory characteristics which would not cause protrusion defects.

In addition, no special mask pattern is necessary for Step 5. In other words, the linear grating formation is possible using the same minimum required number of mask patterns as in the prior art.

In general, the combination of the reticle patterns used in forming the linear grating and their order of use is not limited to the examples described in this embodiment and in the prior art, but numerous combinations exist. However, the formation method of this invention cannot be applied to all combinations. This will be described with reference to FIG. 4A and FIG. 4B.

Figure 4A:
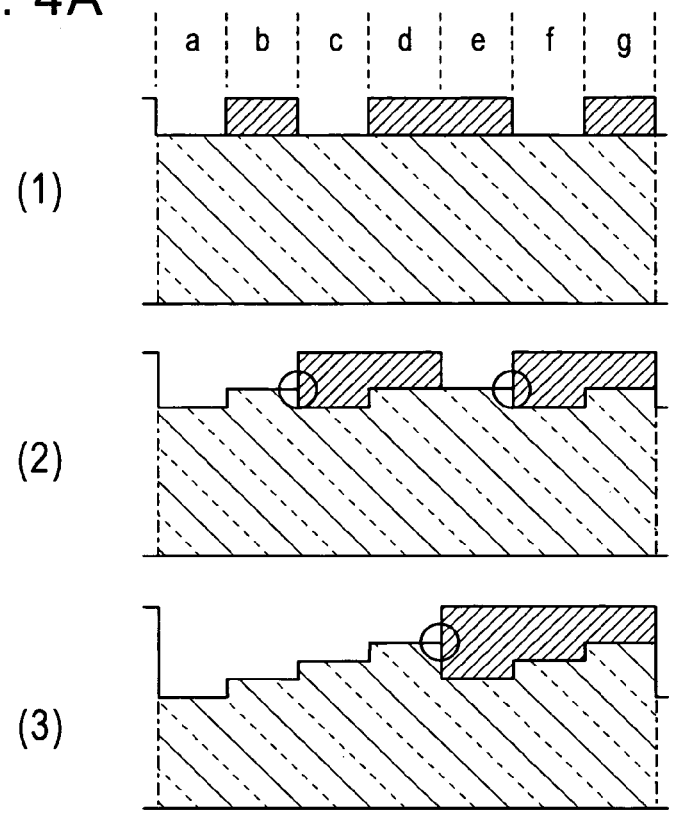
FIG. 4A and FIG. 4B are diagrams useful to explain application conditions of the invention.
Figure 4B:
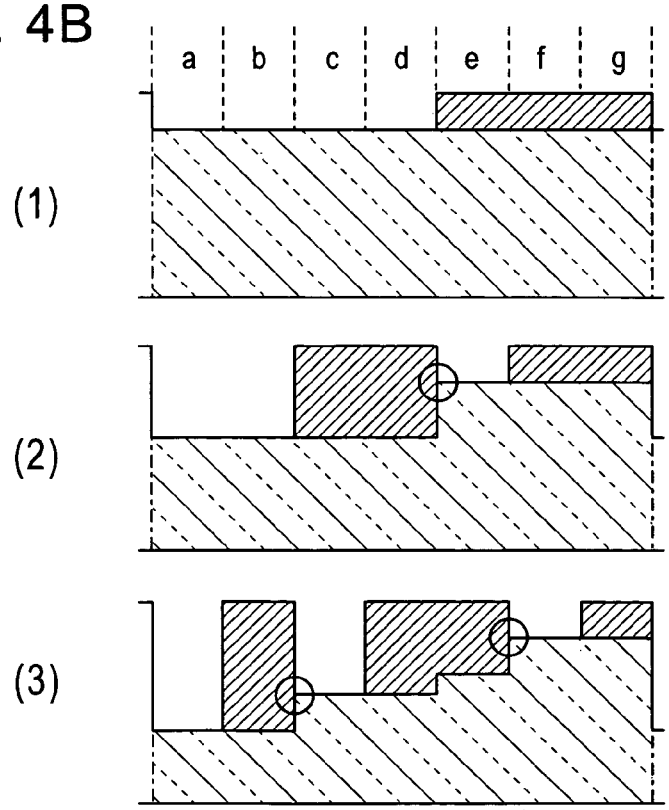

FIG. 4A shows an applicable example. This is the above described embodiment. On the other hand, FIG. 4B shows an inapplicable example. This is the example described with reference to FIG. 2A through FIG. 2F. Below, the conditions of applicability of this invention are explained for combinations of reticle mask patterns and their orders of use.

In general, protrusion defects occur in an adjacent region to a target region (the target region is a region in which the resist pattern is formed) due to shifts in resist position, if the adjacent region is higher than the target region, as indicated by circles in FIGS. 4A and 4B. That is, the resist pattern with position shifted rides up onto the adjacent silicon substrate surface.

In FIG. 4A(2) and 4A(3), three resist patterns are shown, and all the circles are marked on the resist patterns on the same side (the left side) of the respective resist patterns. Besides, these circled regions are the highest step regions (top surface) of the silicon substrate.

On the other hand, in FIG. 4B(3), the circle marked on the leftmost resist pattern is not on the highest step region (top surface) of the silicon substrate. Consequently, Step 8 of this embodiment cannot be performed. Specifically, the surface of the leftmost resist pattern (FIG. 4B(3)) cannot be made the same height as the top surface of the silicon substrate through etching for material removal. Thus, this invention cannot be applied.

In order to effectively apply the formation method of this invention, the following two conditions must be satisfied simultaneously.

(1) When protrusion defects occur in the same mask pattern, all the protrusion defects occur only on one side of the resist pattern, and on the same side.

(2) The step of the silicon substrate at which protrusion defects occur adjacent to a resist pattern is the uppermost step.

The above-described embodiment is provided merely to elucidate the technical nature of the invention. This invention should not be interpreted narrowly as limited to the above embodiment, but can be implemented, with various modifications, within the scope defined by the claims. For example, although the above described embodiment deals with a method of forming a seven-step linear grating, the invention can be applied to formation of a linear grating having six steps, or eight steps, or an arbitrary number of steps.

The materials, dimensions, shapes and similar are not limited to those of the example. Also, any combination of mask patterns may be used, so long as the above conditions (1) and (2) are met.

This application is based on a Japanese Patent Application No. 2004-57713 filed on Mar. 2, 2004, and the entire disclosure thereof is incorporated herein by reference.

What is claimed is:

1. A method of forming a linear grating with a stair-like structure by using in order a plurality of mask patterns for exposure to form resist patterns on a silicon substrate through photolithographic techniques, and etching the silicon substrate, said method comprising:

selecting a mask pattern such that, when a shift in position of a resist pattern occurs due to a shift in exposure, an edge portion of the resist pattern at which a protrusion defect will occur on said silicon substrate is limited to an uppermost step of said stair-like structure, and the edge portion exists only on a predetermined side of the resist pattern;

adjusting a position of the selected mask pattern and forming said resist pattern on said silicon substrate with the selected mask pattern such that the resist pattern completely covers a surface of the substrate at which said protrusion defect will occur;

etching an entire surface of the resist pattern formed on said silicon substrate until a height of the resist pattern becomes the same height as the surface of the silicon substrate before processing, thereby leaving the resist pattern as a lower resist pattern;

adjusting the position of the selected mask pattern and exposure dose, and forming an upper resist pattern such that an edge portion of the upper resist pattern at which a protrusion defect will occur is positioned on said lower resist pattern, and an opposite edge portion of the upper resist pattern is formed in a predetermined position; and, etching said silicon substrate while using said lower resist pattern and said upper resist pattern as a mask.

2. The method according to claim 1 further including hardening the resist pattern prior to said etching said entire surface of the resist pattern.

3. The method according to claim 2, wherein said hardening includes irradiating the resist pattern with a ultraviolet ray.

4. The method according to claim 1, wherein a height of each step in said stair-like structure is at least about 0.2 μm.

5. The method according to claim 1 further including etching a back surface of the silicon substrate after etching said silicon substrate.

6. A method of forming a linear grating with a stair-like structure by using a mask pattern for exposure to form a resist pattern on a silicon substrate through photolithographic techniques, said method comprising:

providing a silicon substrate;

selecting a mask pattern such that, when a shift in position of a resist pattern occurs due to a shift in exposure position, an edge portion of the resist pattern at which a protrusion defect will occur on said silicon substrate is limited to an uppermost step of said stair-like structure, and the edge portion exists only on a predetermined side of the resist pattern;

adjusting a position of the selected mask pattern and forming said resist pattern on said silicon substrate with the selected mask pattern such that the resist pattern covers a surface of the substrate at which said protrusion defect will occur;

etching a surface of the resist pattern formed on said silicon substrate until a height of the resist pattern becomes the same height as the surface of the silicon substrate before processing, thereby leaving the resist pattern as a lower resist pattern;

adjusting the position of the selected mask pattern and exposure dose, and forming an upper resist pattern such that an edge portion of the upper resist pattern at which a protrusion defect will occur is positioned on said lower resist pattern, and an opposite edge portion of the upper resist pattern is formed in a predetermined position; and, etching said silicon substrate while using said lower resist pattern and said upper resist pattern as a mask.

7. The method according to claim 6 further including hardening the resist pattern prior to said etching said surface of the resist pattern.

8. The method according to claim 7, wherein said hardening includes irradiating the resist pattern with a ultraviolet ray.

9. The method according to claim 6, wherein a height of each step in said stair-like structure is at least about 0.2 μm.

10. The method according to claim 6 further including etching a back surface of the silicon substrate after etching said silicon substrate.

* * * * *